(12) United States Patent
Kroyan (10) Patent No.: US 7,232,630 B2
(45) Date of Patent: Jun. 19, 2007

(54) METHOD FOR PRINTABILITY ENHANCEMENT OF COMPLEMENTARY MASKS

(75) Inventor: Armen Kroyan, San Francisco, CA (US)

(73) Assignee: Synopsys, Inc, Mountain View, CA (US)

( * ) Notice: Subject to any disclaimer, the term of this patent is extended or adjusted under 35 U.S.C. 154(b) by 288 days.

(21) Appl. No.: 10/734,318

(22) Filed: Dec. 11, 2003

(65) Prior Publication Data

US 2005/0130047 A1    Jun. 16, 2005

(51) Int. Cl.
G03F 1/00 (2006.01)
G06F 17/50 (2006.01)

(52) U.S. Cl. .......................... 430/5; 716/19
(58) Field of Classification Search ............ 430/5, 430/30, 394; 716/19–21
See application file for complete search history.

(56) References Cited

U.S. PATENT DOCUMENTS

| | | | |
|---|---|---|---|
| 5,825,647 A * | 10/1998 | Tsudaka ................. | 700/57 |
| 6,383,719 B1 * | 5/2002 | Bula et al. ............. | 430/312 |
| 6,534,242 B2 * | 3/2003 | Sugita et al. .......... | 430/312 |
| 6,787,271 B2 * | 9/2004 | Cote et al. ............. | 430/5 |
| 6,821,689 B2 * | 11/2004 | Pierrat ................... | 430/5 |
| 2002/0122994 A1 | 9/2002 | Cote et al. ............. | 430/5 |
| 2002/0187636 A1 | 12/2002 | Pierrat et al. ......... | 438/689 |
| 2003/0162102 A1 | 8/2003 | Pierrat .................. | 430/5 |

* cited by examiner

*Primary Examiner*—S. Rosasco
(74) *Attorney, Agent, or Firm*—Silicon Valley Patent Group LLP; Omkar Suryadevara (57) ABSTRACT

When substantially all features in a layout for a layer of material in an integrated circuit (IC) are defined using a phase shifting mask, the related complementary mask that is normally used to define the remaining features and edges can be improved if intensities in an aerial image from openings on the complementary mask that are below threshold are increased to ensure that each opening meets or exceeds threshold. Such increase of intensities improves effectiveness of critical openings that are otherwise too small to print. Absent intensity increase, such openings could limit the application of optical lithography using phase shifting masks to ever shrinking technologies. The intensities are increased in some embodiments by enlarging some openings in the complementary mask in directions not constrained by features to be formed in an integrated circuit (by use of the phase shifting mask).

10 Claims, 9 Drawing Sheets

Exemplary Inner Corner Cuts 600

METHOD FOR PRINTABILITY ENHANCEMENT OF COMPLEMENTARY MASKS

BACKGROUND

1. Field of the Invention

The invention relates to fabricating semiconductor chips. More specifically, the invention relates to a method and an apparatus for increasing the maximum intensity of poorly-defined regions in an image formed by a complementary mask that is normally used to expose (and remove) unwanted regions located between phase shifters of a phase shifting mask during an optical lithography process used in fabricating a semiconductor chip.

2. Related Art

Optical lithography process begins with the formation of a photoresist layer on the surface of a semiconductor wafer. A mask composed of opaque regions, which are generally formed of chrome, and light-transmitting clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some type of electromagnetic radiation source together with suitably adapted masks and lithography equipment.

This image is reduced and focused through an optical system containing a number of lenses, filters, and mirrors. The light passes through the clear regions of the mask and exposes the underlying photoresist layer. At the same time, opaque regions of the mask block the light leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

As integration densities continue to increase, it is becoming desirable to use phase shifters to define more and more features within a layout. This can lead to problems in some situations. For example, a desired feature can be formed using zero-degree phase shifter and 180-degree phase shifter of a phase shifting mask (PSM), and normally there remains a small region between shifters which is not intended to print. Such regions on a wafer under fabrication which result from use of the phase shifting mask are normally cleared by a complementary, or trim, mask during the optical lithography process.

Figure 1A:
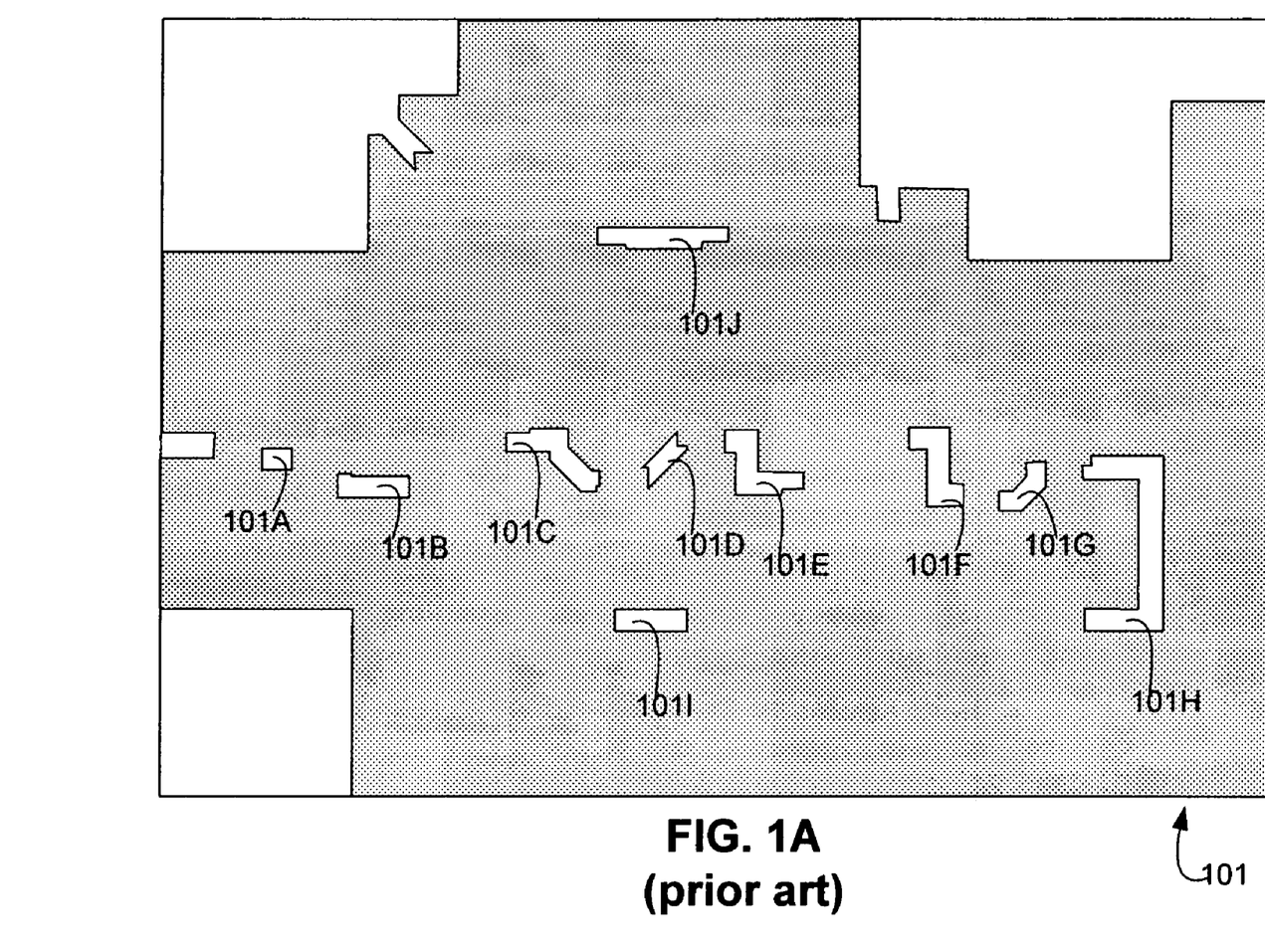
FIG. 1A illustrates a complementary mask 101 of the prior art that includes openings 101A–101H for clearing phase conflicts generated by a phase shifting mask (not shown in FIG. 1A).
Figure 1B:
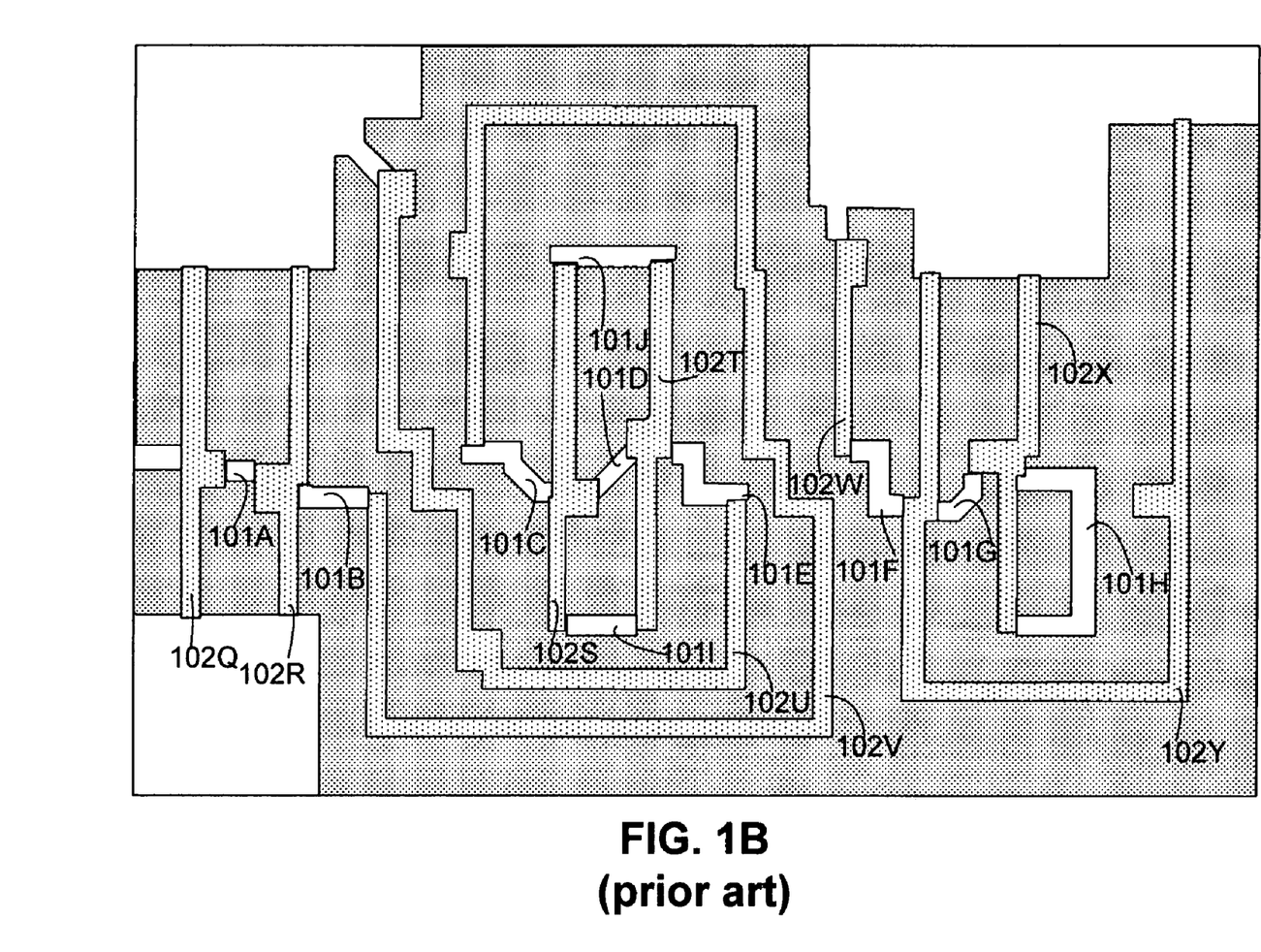
FIG. 1B illustrates the prior art mask 101 of FIG. 1A overlaid with features 102Q–102Y to be produced by exposure through the phase shifting mask (not shown in FIG. 1B).

A complementary mask 101 shown in FIG. 1B (also known as a trim mask) for use with a phase shifting mask (not shown) provides a number of openings at appropriate locations to fully expose any unwanted photoresist that may be left from use of the phase shifting mask. For example, opening 101A on complementary mask 101 is located to remove unexposed photoresist that would cause bridging between features 102Q and 102R (see left side of FIG. 1B). Note that the features to be formed are shown in FIG. 1B superposed on complementary mask 101 for ease in illustrating the locations of openings and features relative to one another. Also note that although a limited number of openings are shown in the attached figures for illustrative purposes, it will be understood that any number of such openings may be present in a complementary mask and/or phase shifting mask, depending on, for example, circuitry in a wafer to be formed using the masks.

As technology dimensions shrink to 65 nm and smaller, the intensity of radiation through one or more of openings (also called "cuts" or "cutouts") 101A–101H in trim mask 101 (FIG. 1A) drops to such a low level as to become ineffective in exposing (and therefore removing) unwanted photoresist. The issue of insufficient intensity through the trim mask openings imposes limits on the overall performance of full phase technology using such a trim mask (following the use of a phase shifting mask).

Figure 1C:
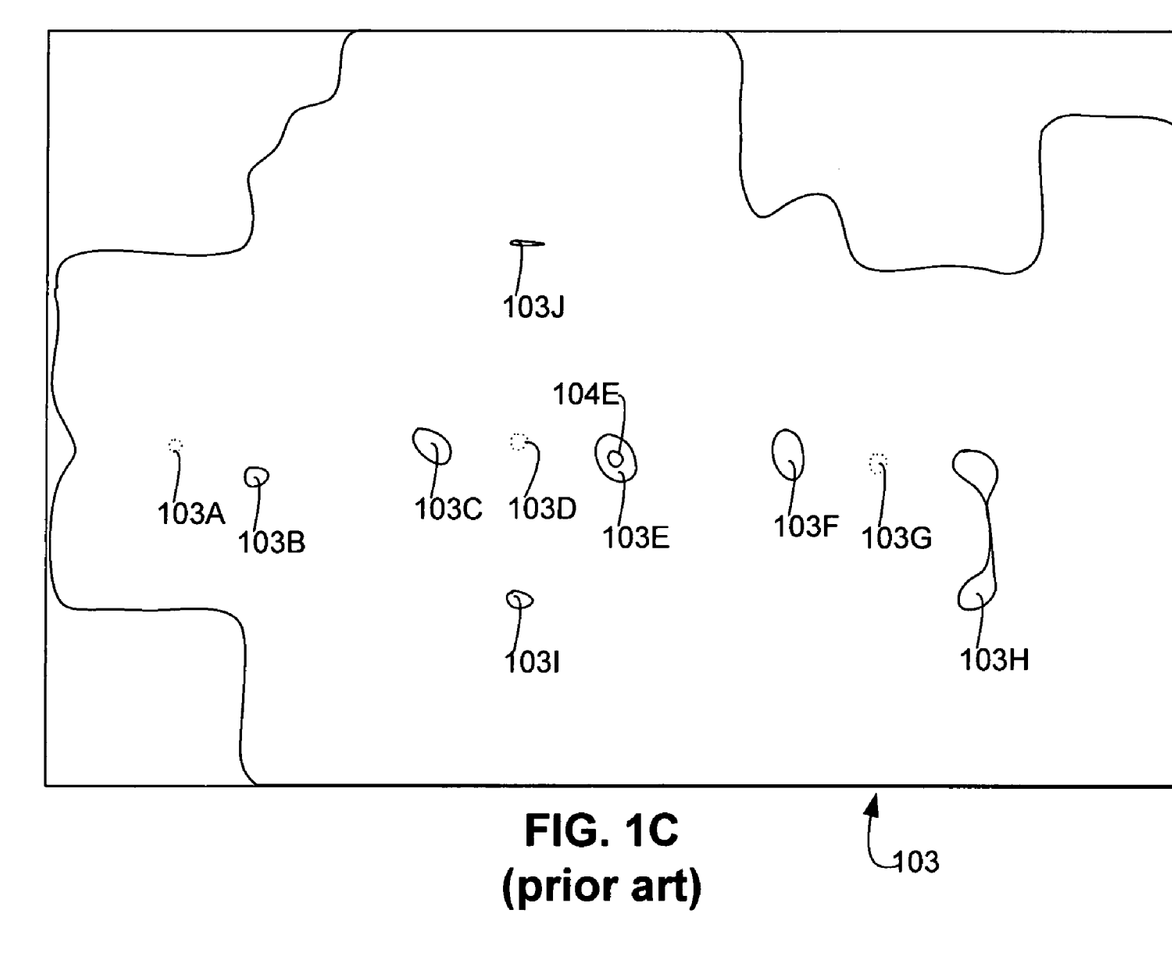
FIG. 1C presents an aerial image 103 (also prior art) illustrating the effects of openings on complementary mask 101.

For an example of this problem, see aerial image 103 (FIG. 1C) illustrating the effects of openings 101A–101H in trim mask 101 (FIG. 1A). Image 103 was obtained from a trim-level test cell layout with 65 nm design rules and aerial image simulation at the following image settings: λ=193 nm, 0.8 NA, and 0.2 σ (partial coherence) at best focus. FIG. 1C shows a contour plot of the aerial image, with levels of intensity being marked by solid or dotted lines. Note that image 103 has its brightest intensity in region 104E (FIG. 1C) which is surrounded by a slightly lower intensity region 103E. Regions 103E and 104E are portions of a continuum of intensities with the highest intensity at the center of region 104E.

As shown in FIG. 1C, opening 101A (which may be, for example, a square of 10 nm on each side) produces a region of very low intensity, namely region 103D (FIG. 1C) which is shown by a dotted line. For this reason, region 103D will be "poorly defined" on a wafer. Due to unacceptably low intensity in several regions (e.g. regions 103A and 103D), their respective openings (e.g. openings 101A and 101D) are ineffective in exposing—and therefore permitting removal of—unwanted photoresist in conjunction with the use of a phase shifting mask. For example, when such a trim mask 101 (FIG. 1A) is used, features 102Q and 102R (FIG. 1B) are likely to remain connected to one another despite the presence of opening 101A, because of insufficient intensity in the corresponding regions of the aerial image generated by mask 101.

In some embodiments the complementary, or trim, mask may include phase shifters, e.g. attenuated background.

SUMMARY

Several embodiments of the invention receive a complementary mask, which uses openings (also called "cuts" or "cutouts") to clear unwanted regions left by use of a phase shifting mask, and increase intensities in an aerial image formed by openings in the complementary mask, sufficiently to meet or exceed a threshold. The just-described increase in intensities eliminates one or more poorly defined regions in the aerial image. In some embodiments, no attempt is made to increase the intensity of every single cut, especially not really large openings which have substantially the same maximum intensity. Instead, in such embodiments, each critical opening (which results in a poorly defined region) is modified (e.g. size enlarged and/or shape simplified) so that its intensity is also substantially same as the just-described maximum intensity.

An opening is considered "critical" by the inventor if, for given image settings, it results in a region (called "poorly defined region") that is ineffective in exposing photoresist during a given wafer fabrication process. As will be apparent to the skilled artisan, the criticality of an opening depends not only on image settings but also on the wafer fabrication process. Inventor notes that in an optical system with given image settings, variation in the size of an opening does not affect resolution, if the opening is small enough to be modeled by a pin hole (in which case resolution is defined by the point-spread function). Under such circumstances, some embodiments implement an intensity increase of the type described herein by appropriately increasing the areas of openings in the complementary mask that otherwise generate poorly defined regions.

In a variation of such embodiments, the increase in area is substantially proportional to the difference between (1) maximum image intensity of an opening being modified prior to the area increase, and (2) the substantially identical maximum intensity for all openings (or the predetermined target maximum intensity). Such embodiments are based on an approximately linear relationship between the area of each opening and the maximum image intensity.

In a variation of such embodiments, the areas are increased by enlarging openings (that need their maximum intensity to be increased) in directions not constrained by features to be formed in an integrated circuit (by use of the phase shifting mask). For example, the area increase can be accomplished by moving an edge that does not abut any "to-be-formed" features.

As noted above, in some embodiments, maximum intensity increase of the type described herein is limited to only those openings in the complementary mask that are too small to print. Such openings are identified as having areas that are below a threshold, and therefore too small to generate a predetermined intensity, and then areas of only the identified openings are increased and/or shapes of such openings are simplified.

DETAILED DESCRIPTION

Introduction

In several embodiments of the invention, a computer is programmed to receive a complementary mask 101 (FIG. 1A) which uses openings 101A–101H to clear unwanted regions left by use of a phase shifting mask. Thereafter, the image intensities in regions 103A–103H in aerial image 103 (FIG. 1B) formed by openings 101A–101H in complementary mask 101 are increased if necessary by the programmed computer by modifying mask 101. The modified complementary mask forms an aerial image with at least a minimum intensity which meets or exceeds a threshold, for substantially all openings thereon, as discussed herein, for several illustrative embodiments.

Depending on the embodiment, image intensity modification for a complementary mask can be implemented in any of a number of different ways that would be apparent to the skilled artisan in view of this disclosure. For example, techniques used in image intensity balancing for a phase shifting mask can be applied to increase image intensities of poorly defined regions of a complementary mask in some embodiments of the invention. For a discussion of such techniques, see U.S. patent application entitled "Phase Shifting Mask Topography Effect Correction Based on Near-Field Image Properties" by the same inventor, namely Armen Kroyan, filed 9 Oct. 2002 and having the application Ser. No. 10/268,874 (Synopsys Docket # 0796) and assigned to the assignee of the current application, namely Numerical Technologies, Inc., a wholly owned subsidiary of Synopsys, Inc. The just-described patent application is incorporated by reference herein in its entirety. During image intensity increase, some embodiments of the type described herein move edges of one or more of openings 101A–101N in complementary mask 101, depending on the criticality of the opening. Movement of edges of critical openings can be implemented in any of a number of different ways that would be apparent to the skilled artisan in view of this disclosure. For example, techniques used optical proximity correction (OPC) for a complementary mask can be applied to image intensity balancing in some embodiments of the invention. For a discussion of such techniques, see U.S. patent application entitled "Performing Optical Proximity Correction on Trim-level Segments Not Abutting Features To Be Printed" by Christophe Pierrat, filed 21 Oct. 2002 and having the application Ser. No. 10/277,250 (Synopsys Docket #0794) and also assigned to the assignee of the current application, Numerical Technologies, Inc., a wholly owned subsidiary of Synopsys, Inc. The just-described patent application is incorporated by reference herein in its entirety. Note that at the relevant times inventors Armen Kroyan and Christophe Pierrat were under a duty of common assignment to the assignee of the present application (Numerical Technologies, Inc.), and/or (subsequent to 1 Mar. 2003) the owner of Numerical Technologies, Inc., Synopsys, Inc.

Process of Modifying a Complementary Mask (Flow Chart)

Figure 2:
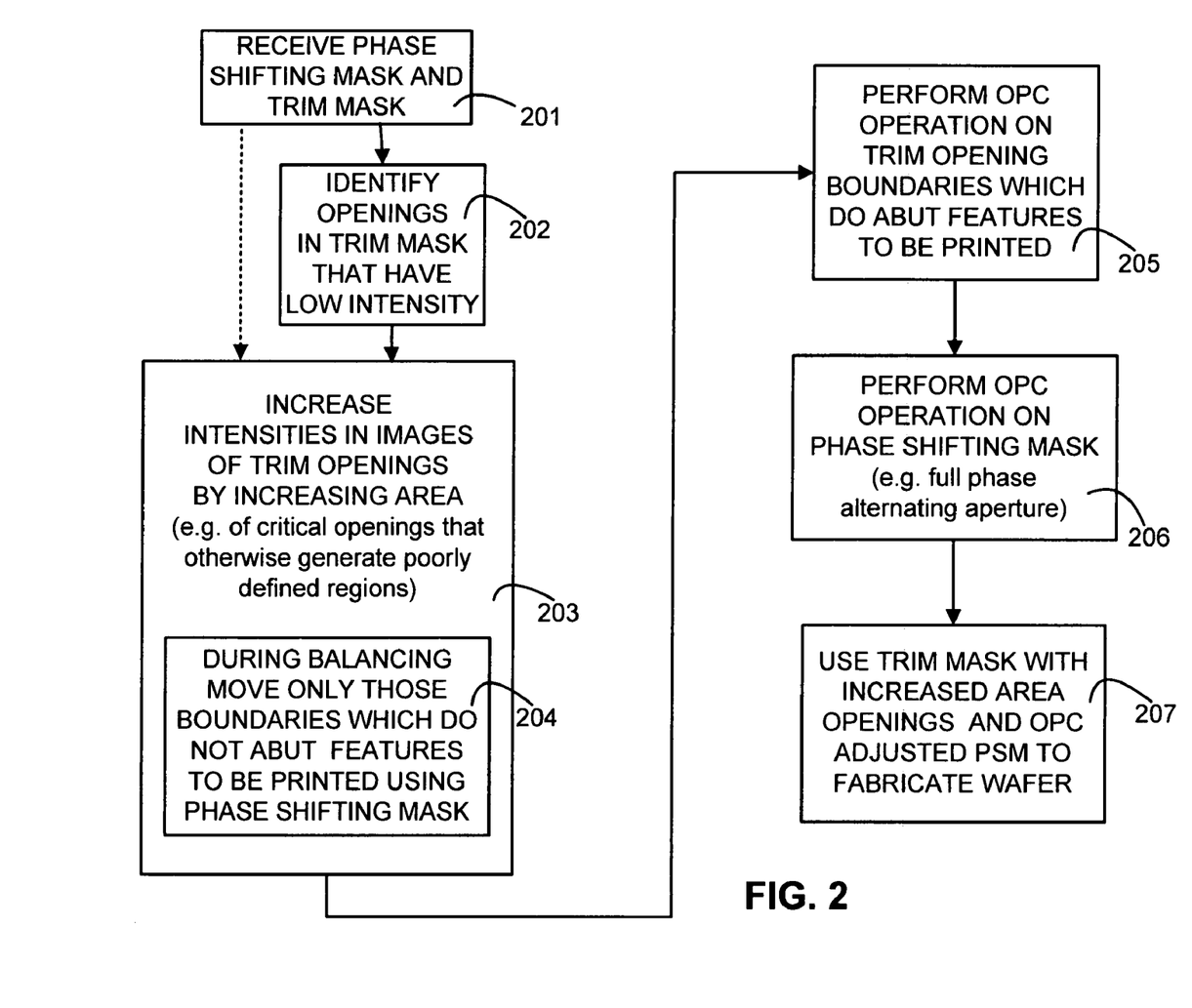
FIG. 2 illustrates, in a flow chart, acts performed in some embodiments of the invention, including the balancing of intensities of openings in the complementary mask.

FIG. 2 illustrates the process of modifying a complementary mask to ensure that each opening in the mask generates a maximum image intensity which is substantially the same as other openings on the complementary mask or as a predetermined target maximum intensity. The system (which may be a programmed computer or other apparatus) starts by receiving a phase shift mask and a complementary mask (act 201). In some embodiments, the computer is a workstation computer running a UNIX®-like operating system, e.g Linux™, Solaris™, etc. In some embodiments, this process is carried out by suitably modified versions of Synopsys, Inc., software programs such as the iN-Tandem®, iN-Phase® and/or Proteus™ software programs.

For example, in some embodiments the mask layouts are received at act 201 in a GDS-II file format or they can be retrieved from a Milkyway™ database accessed across a network. The Milkyway™ database format is a Synopsys-led alternative design storage format that many Synopsys and third party tools support, other formats could include the OpenAccess format from Si2/Cadence, Inc., etc. The program performing the acts of FIG. 2 would have to be modified to appropriately support the relevant input formats.

Next, the system identifies critical openings on the complementary mask, e.g. those openings that are likely to generate poorly defined regions in an aerial image (act 202). Regions are poorly defined if exposure in a wafer fabrication step generates results that are not within acceptable tolerances for fabricating the wafer (e.g. depending on dosage and residue left). This act 202 can involve identifying openings that have areas below a predetermined threshold, and the predetermined threshold may be determined in any number of ways. For example, for given image settings, simulation, or actual experiment may be performed with openings of different sizes to identify the threshold area below which openings are too small to generate a predetermined maximum intensity in the aerial image. Hence, openings in the complementary mask which have an area below the just-described threshold area are identified in act 202 as being "critical." Depending on the embodiment, such methods may be either automated (in the system) or manual or some combination thereof. Note further that act 202 is optional and in some embodiments act 202 is skipped altogether. In the case where the criticality labeling step 202 is skipped, a threshold (e.g. desired) aerial image intensity can be chosen and then image intensities of all openings can be reviewed and increased to meet or exceed that threshold.

In some instances, it may even be desirable to mildly reduce the size of some openings to bring all of the critical openings closer in size. Then in turn, the dosage can be increased for the whole mask, to ensure that none of the critical masks generate poorly defined regions in the aerial image. Therefore, some embodiments increase the size of a critical opening as discussed in the next paragraph [0032], other embodiments decrease the size of a critical opening, while still other embodiments do both (i.e. enlarge some openings and reduce some openings). Regardless of whether an opening of a complementary mask opening is enlarged or reduced, such a change in opening size is a modification that is deliberately performed in many embodiments of the invention. An opening in a complementary mask may also be modified in some embodiments without changing the opening size, e.g. if its shape is changed (e.g. simplified as discussed in paragraphs [0048]–[0050] below). Any one or more such modifications of complementary mask openings may be performed in accordance with the invention to eliminate the prior art formation of poorly defined regions.

Referring to FIG. 2, the system balances the maximum image intensities of the trim openings (as per act 203), e.g. by increasing the area of one or more trim openings. The trim openings that the system works on in act 203 may be limited to just the critical openings identified in act 202 if performed in some embodiments or in alternative embodiments on all openings in the mask received in act 201. For example, it is in this act 203 that the prior art opening 101A is enlarged in area, thereby to allow more radiation to pass therethrough. The increased radiation in turn increases the maximum intensity of the image formed by the enlarged opening, thereby to bring the maximum image intensities into balance across the entirety of the complementary mask.

To achieve printability, the maximum image intensities of the various critical openings need not be made precisely identical to a threshold intensity, and instead they may be made substantially identical (e.g. within 10% of the threshold intensity). Note further that depending on the embodiment, there may be a threshold intensity that is not achievable by all critical openings at given image settings, in which case the image settings may be changed (e.g. dosage may be increased). Again, in such embodiments, the various maximum image intensities may be made only substantially identical to one another instead of precisely identical, and an increase in dosage automatically increases all intensities to meet or exceed the threshold.

Also, if a target maximum image intensity is used, then it may be either user specified or automatically computed using a predetermined rule that uses image settings of the system. The target can be computed through simulation. The goal is to find a relative intensity that is high enough to clear each critical opening (at a given focus, e.g. at the edge of the depth of focus) The simulations can be performed manually or in an automated fashion or a combination thereof. In some embodiments, the target maximum image intensity is selected to be sufficient to erase underlying features.

Enhancement of maximum intensities in an aerial image from a complementary mask as illustrated in act 203 performed by several embodiments of the invention improves effectiveness of critical openings in the complementary mask that are, otherwise, too small to print. In contrast, presence of any "too-small-to-print" openings in a prior art complementary mask limits the application of optical lithography using phase shifting masks to ever shrinking technologies.

During the intensity enhancement act 203, some embodiments implement the area increase of each opening by performing a specific act 204 (FIG. 2) which is described next, although in other embodiments the area increase may be implemented in other ways that would be apparent to the skilled artisan in view of the disclosure. Specifically, some embodiments perform act 204 by moving only those boundaries of a trim opening (whose area is being increased) that do not abut features to be printed using the phase shifting mask. Any boundaries that do abut features to be printed using the phase shifting mask are left unmoved.

In some variants of the above-described embodiments, identification of openings to be enlarged in act 202 involves modeling (by simulating) exposure through each of the phase shifting mask and the complementary mask, to produce a result and examining the result. Depending on whether or not the threshold is reached for all image intensities on a single performance of act 203, the (a) modeling of exposure (e.g. by simulating) in act 202 and (b) intensity increase in act 203 can be performed repeatedly one after another iteratively in a loop until all openings in the complementary mask generate an aerial image with maximum image intensities that meet or exceed the threshold. The iterative looping may be terminated after a preset number of iterations in case there is no solution. As noted above, identification act 202 is optional and for this reason, in some embodiments, only intensity enhancement act 203 is performed iteratively. In some alternative embodiments, no acts are repeated (and therefore there are no iterations).

After modification of the complementary mask as discussed above, additional acts 205–207 are performed in a number of embodiments, as discussed next. Specifically, in act 205 an optical proximity correction (OPC) operation is performed on all boundaries of trim openings (regardless of whether their area has been increased) that do abut features to be printed using the phase shifting mask. (Note although the term optical proximity correction is used, more generally any of a number of different types of mask proximity effects can be corrected for depending on the software and models/rules used.) Any boundaries that do abut features to be printed using the phase shifting mask are OPC adjusted in the normal manner. This ensures the correct printed shape of the feature and ensures that opening edge do not overlap (scum) with the edges of the material being defined, e.g. polysilicon. Thereafter, in act 206, the OPC operation is performed on the phase shifting mask, also in the normal manner (e.g. adjusting phase shifter edges that abut the original layout features). Next, in act 207 the complementary mask with balanced area openings and OPC adjusted boundaries is used after use of the OPC adjusted phase shifting mask, to fabricate one or more wafers of semiconductor material. Note, although OPC is described herein as mandatory, it is in fact optional, although yield of the printed wafers may be commercially unacceptable in some embodiments. Also, the specific OPC methodology and sequencing (trim vs. phase) and ability to run in parallel can be suitably altered based on the OPC software used (e.g. iN-Tandem vs. Proteus, etc.).

Modification in Proportion to Area of Opening (Graphs)

Figure 3A:
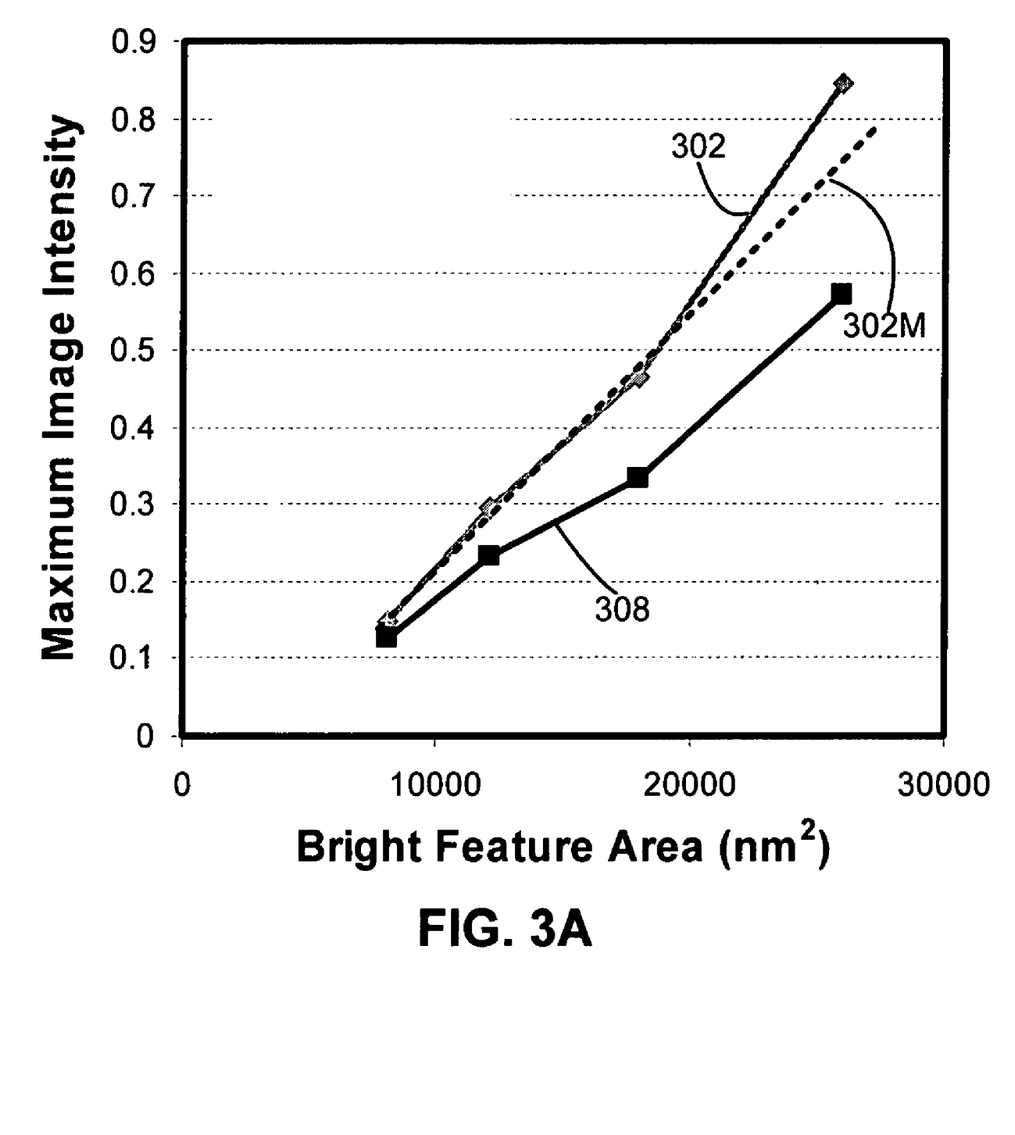
FIG. 3A illustrates, in a graph, approximate linearity of a relation between the area of each opening in a trim mask and the maximum intensity of an aerial image generated by the opening.

In some embodiments, during the above-described balancing act 203, the maximum image intensity is increased in direct proportion to a corresponding increase in an area of the opening in the complementary mask. Such proportional adjustment is performed in embodiments wherein the relation between the area of each opening and the maximum image intensity is substantially linear. Two examples are illustrated in FIG. 3A with curve 302 at 0.2 σ and curve 308 at 0.8 σ, with all other image settings as described above in paragraph [0008]. Note that each of curves 302 and 308 is almost linear.

As noted above, in some embodiments that perform act 204 (described above), only those boundaries of a trim opening (whose area is being increased) that do not abut features to be printed using the phase shifting mask are moved. In such embodiments, an error in the movement of non-abutting boundaries due to non-linearity of curve 302 or 308 is inconsequential, as long as the resulting maximum image intensities are balanced. Therefore, in some embodiments, a straight line 302M (shown dotted in FIG. 3A) is used to model curve 302 in FIG. 3A. Note that line 302M is selected to be more conservative (causes greater increase in area) than necessary, because of non-criticality of boundary adjustment on the balancing act.

Line 302M (FIG. 3A) may be selected in any manner well known in the art, either manually or by use of any line-fitting algorithm. Use of such a straight line 302M speeds up implementation, because the area of an opening can be simply scaled up without need for modeling of one or more aerial images to identify openings to be modified (and the type (such as size/shape) of modification and the amount of modification depending on the embodiment). For example, if the target maximum image intensity is predetermined to be 0.5 mJ/cm² then each opening must have an area of at least 20,000 nm², and therefore each opening having an area below this threshold has its non-abutting boundaries adjusted to reach this area. Therefore, acts 202 and 203 (described above) are implemented in such embodiments by simply checking each opening as to whether the area falls below the threshold amount, and if so increasing to the threshold amount.

Note that the above-described linear relationship between the area of each opening and the maximum image intensity occurs only in certain limited circumstances as discussed next in reference to FIGS. 3B and 3C. Specifically, in a number of embodiments, for given image settings of an optical system, mask feature sizes below certain critical level are modeled as infinitely small openings that are called "pinholes" wherein the resolution is defined by the point-spread function. Below such a critical size, the reduction of feature dimensions results in a decrease of the maximum intensity of the image, without affecting its resolution.

Figure 3B:
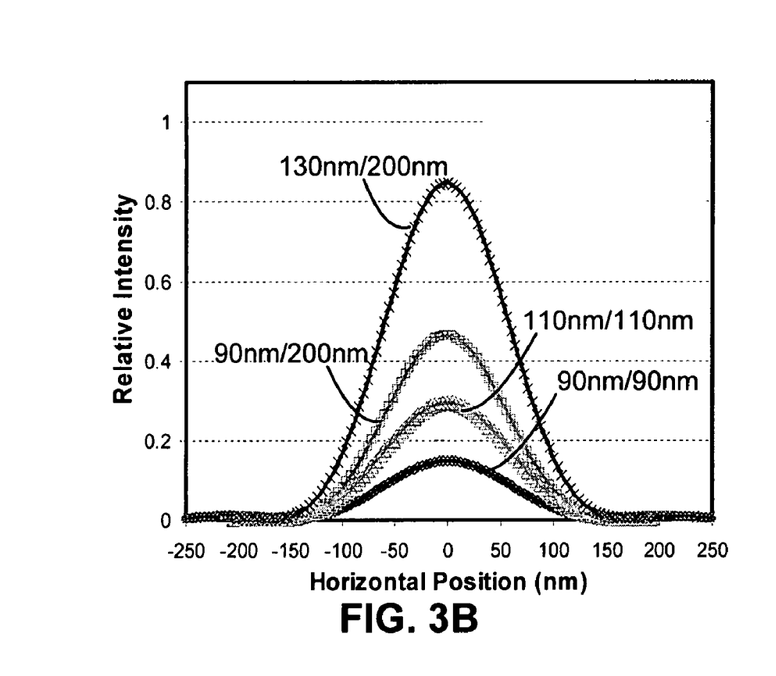
FIG. 3B illustrates, in a graph, the change in intensity as a function of distance from the center of a cut, for openings of different sizes, illustrating a point spread function to be used in accordance with the invention.

Such a decrease in maximum image intensity relative to feature size is illustrated in FIG. 3B. Specifically, as illustrated therein, a square opening that is 90 nm×90 nm in size has the highest relative intensity of 0.82 mJ/cm² and the intensity distribution thereof forms a bell shaped curve around the center of the opening, dropping off to almost zero at ±150 nm. Similarly, a rectangular opening that is 130 nm×200 nm in size has the highest relative intensity of 0.18 mJ/cm² and this intensity distribution is also bell shaped and also drops off to almost zero at ±150 nm from the center.

Figure 3C:
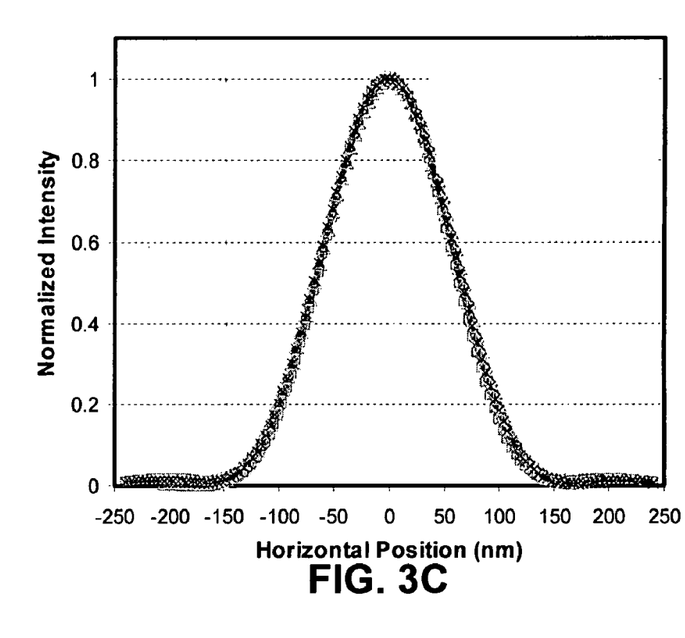
FIG. 3C illustrates the graph of FIG. 3B normalized along the y-axis, illustrating that the point spread function is identical regardless of the size of the cut.

When the just-described curves for each opening are normalized, with maximum image intensity for each curve being set to 1, then the curves coincide with one another as illustrated in FIG. 3C. For this reason, use of a linear model of maximum image intensity as a function of area of the opening serves as an appropriate approximation when implementing balancing in some embodiments.

Trim Mask After Proportional Increase and Boundary Movement

Figure 4:
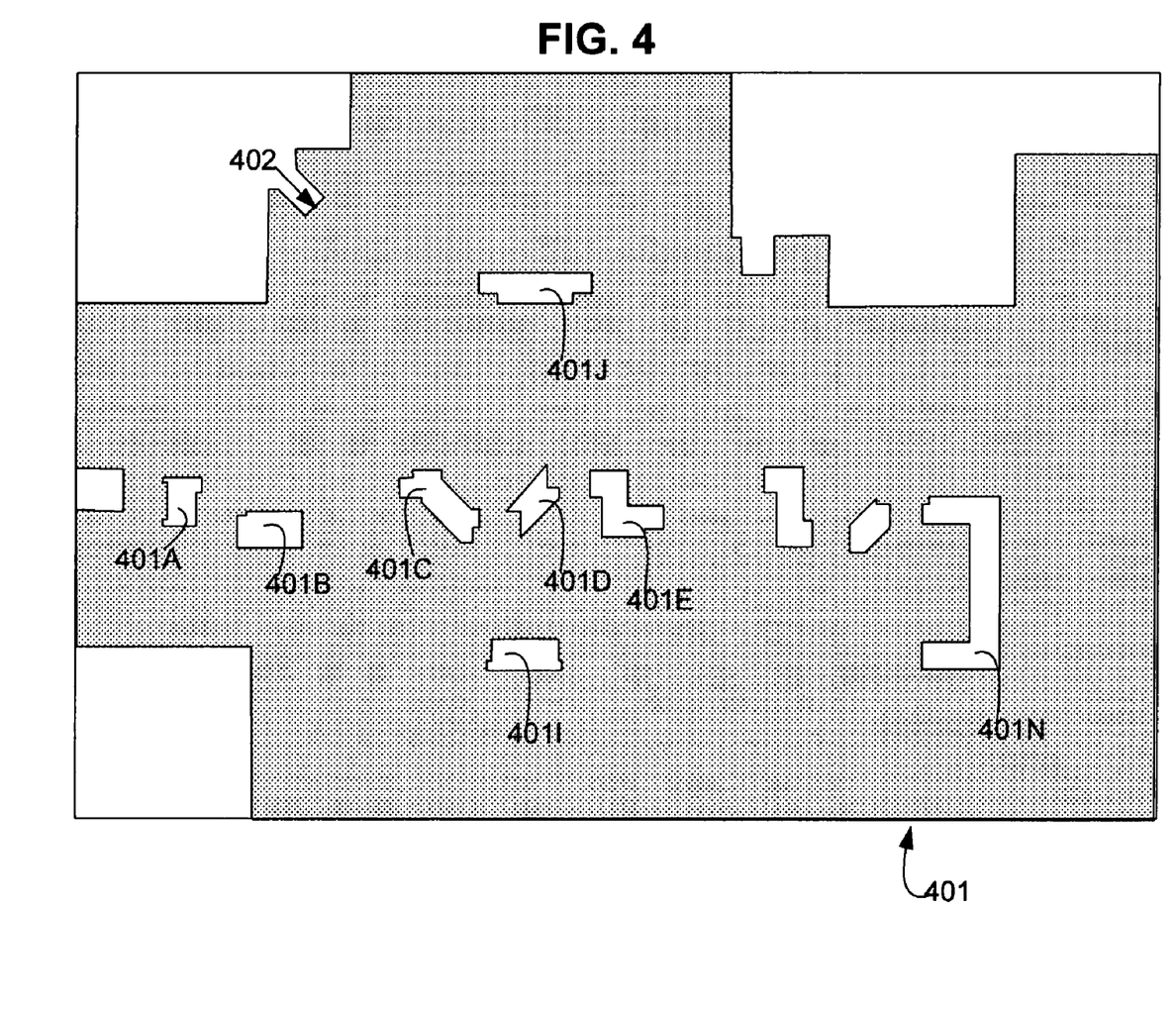
FIG. 4 illustrates the complementary mask of FIG. 1A after balancing intensities in accordance with the invention.

The above-described movement of boundaries may be performed for any number of openings in a complementary mask as may be necessary. For example, if a target maximum image intensity is set to be same as the image intensity at the center of region 104E, then all openings except opening 101E are modified to have increased areas. The adjusted complementary mask 401 is illustrated in FIG. 4. Note that most of reference numerals in FIG. 4 are obtained by adding 300 to the corresponding reference numerals in FIG. 1A. Note that FIG. 4 is manually prepared to illustrate the invention in some embodiments (although a number of openings are shown enlarged in FIG. 4, the specific openings that are in fact enlarged in any given embodiment may be different, depending on the embodiment).

Aerial Image

Figure 5:
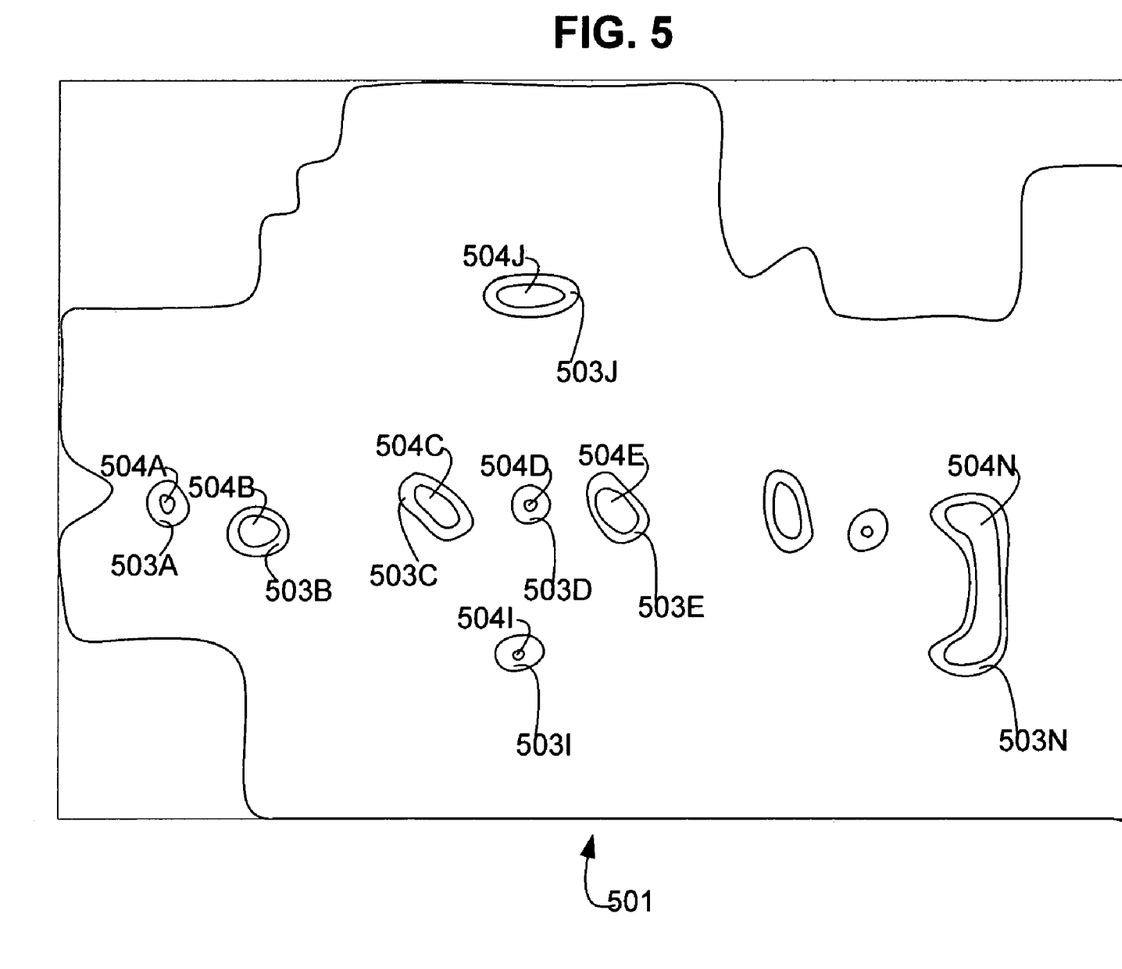
FIG. 5 presents an aerial image 501 illustrating how the increased area of openings on complementary mask 401 affect exposure in accordance with an embodiment of the invention.

FIG. 5 presents an aerial image 501 illustrating how enlarged openings 401A–401N on complementary mask 401 affect a printed layout in accordance with an embodiment of the invention when used in conjunction with a phase shift mask. The exposure conditions are same as those discussed above, and the results are shown at best focus. Note that image 501 has a pair of contours 503A–503N and 504A–504N respectively for each corresponding opening 401A–401N in mask 401. In particular, note the improved definition by contours 503A and 504A formed by opening 401A which has been enlarged from opening 101A during the balancing of maximum image intensities as discussed above.

Contrast the image 501 of FIG. 5 with the corresponding image 103 in FIG. 1C to note the improvement obtained in one example in accordance with the invention. In view of the intensity contours in regions 503A and 504A, it will be apparent that if a bridge between features 102Q and 102R is formed by use of a phase shifting mask, such a bridge is eliminated by radiation incident thereon through opening 401A when complementary mask 401 is thereafter used.

Cut Simplification

Other embodiments of the invention simplify cut shapes created by earlier OPC stages. For example, turning to FIG. 6, an exemplary inner corner cuts 600 are shown for both the phase layer 602 and the complementary, or trim layer 604. Turning first to the phase layer 602, a portion of a feature 610 is being defined by two opposite phase (e.g. θ and θ+180°) shifters, shifter 614 and shifter 612. The opening between the two phase shifters has been designed to minimize the likelihood of a design rule checker (DRC) violation (as thus for compliance with mask manufacturing rules). The shape of the opening is then carried over to the trim layer 604 where the trim 618 has a similar opening (dotted line in the trim layer shows the boundary of the feature 610). See, also, United States Published Patent Application 2002/0122994, assigned to the assignee of the present application, for further discussion of the use of such shapes.

Figure 6:
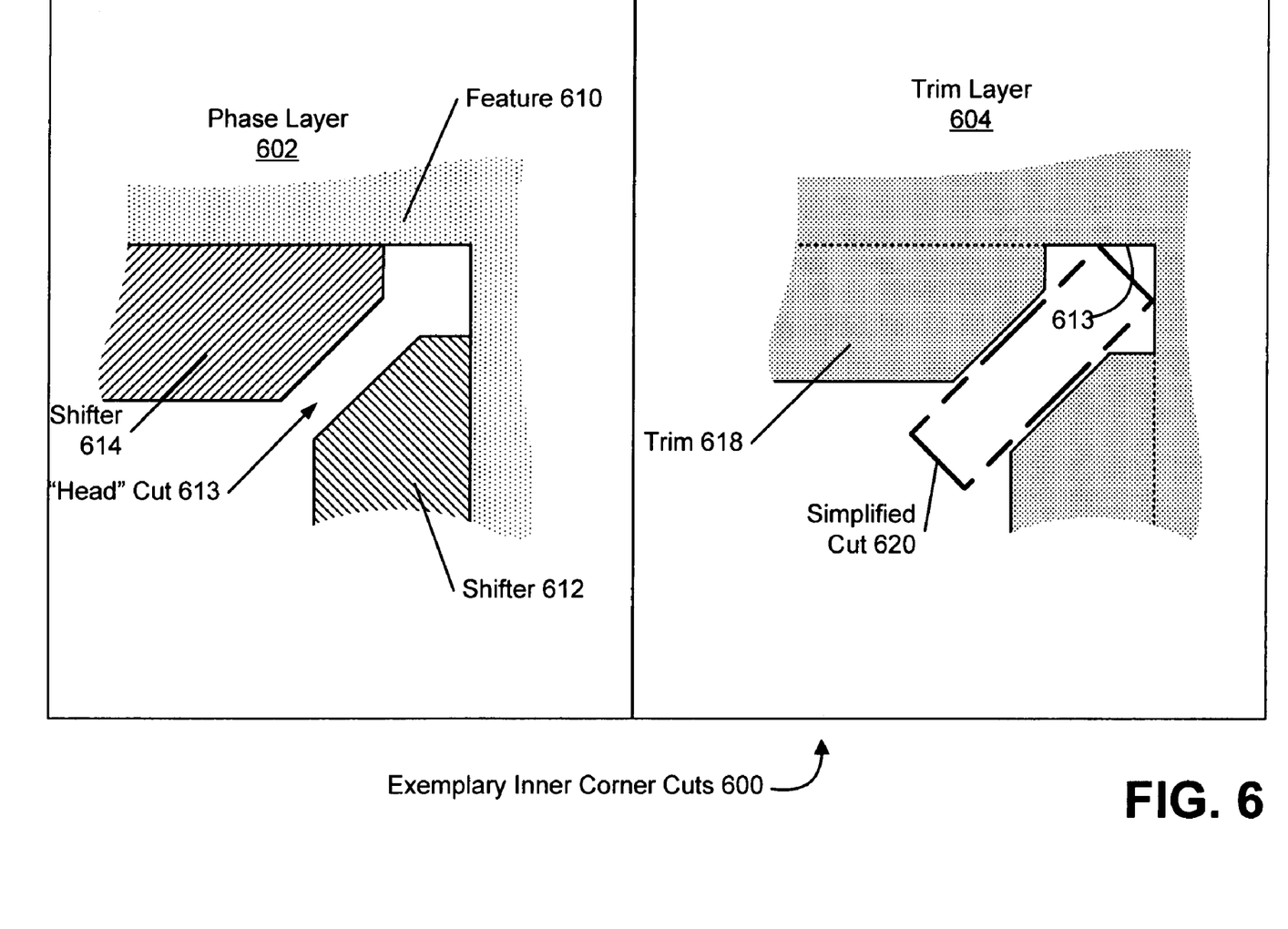
FIG. 6 illustrates simplification of the shape of a cut of a phase shift mask, so as to form a complementary mask cut with fewer sides, in some embodiments of the invention.

However, for certain critical openings in the complementary mask (e.g. trim layer 604 or complementary mask 101), such shaping while making the mask DRC (and mask rule) clean, is not improving the lithographic performance. However, they can be more complex and error prone to manufacture. Thus, in some embodiments of the invention, during the process of FIG. 2, the openings are simplified into more basic shapes which have fewer sides, e.g. a rectangle at forty-five degrees instead of an arrow "head". For example, a head cut 613 in FIG. 6 (also shown between the shifters 612 and 614 in the phase layer 602) which is a complex shape is replaced by cut 620 of trim 618 (note that cut 620 is simpler, and is shown in FIG. 6 as a heavy-dashed rectangle).

Such simplifications can reduce mask complexity and write time without reducing the performance of the ultimate masks. Therefore, inventor notes that trim openings can also be modified in another manner as discussed above. Specifically, trim openings that are complex are simplified in accordance with another aspect of the invention because the complexity of trim openings is not transferred into the aerial image. The lack of transfer occurs due to diffraction-limited imaging in sub-wavelength lithography. Due to the small dimensions of trim openings extending into sub-100 nm range, only the zero and first diffraction orders form their image, while all of the higher orders do not make it through the projection lens. Thus, a trim opening in a shape of a complex polygon images very similarly to a basic rectangle of a similar size. Therefore, in accordance with this aspect of the invention, trim openings are significantly simplified without sacrificing their overall printability. Many of the complex polygons that form a trim opening are substituted by one or more simple rectangles (or their combination). This aspect of the invention not only dramatically simplifies trim-level OPC conversion, but also helps to significantly reduce mask making costs and mask write time. The substitution of a complex polygon with a simplified trim opening can be performed using any straight line fitting algorithm well known in the art, as would be apparent to the skilled artisan in view of this disclosure.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. Numerous such modifications and adaptations of the embodiments and variants described herein are encompassed by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process of FIG. 3.

Although in some embodiments the balancing of a complementary mask involves maximum image intensity, in other embodiments, any other aerial image metric (such as image log-slope) can be used in a similar or identical manner. As is well known in the art, the image log slope is the slope of the logarithm of the aerial image at the nominal line edge.

Note that although this disclosure contains titles and subtitles, the use of titles and subtitles is merely for convenience of the inventor. Specifically, the subtitles are not to be construed as limiting the detailed description of any feature to only paragraphs following the subtitle related to that feature. Accordingly, any portion of this disclosure may be used, in its appropriate context, to understand one or more features of the invention either individually or in combination thereof.

Although in some embodiments the openings in a complementary mask are modified automatically (e.g. the area of a critical opening is automatically enlarged) sufficiently to avoid formation of poorly defined regions in the aerial image, several other embodiments actively use feedback from a human user in modifying the complementary mask. Specifically, such other embodiments use a model based iterative method, wherein a small modification (e.g. an aerial increase by a user-specified amount) is modeled for one or more critical openings, and the resulting aerial image is displayed to the user. The modification may be specified by the user, for example, as a percentage in which case the critical openings are scaled up by the specified percentage (in some embodiments). Alternatively, as noted above, the modification may be specified by the user as a simplification of the shape of a cut, e.g. by the user drawing a rectangle which partially or completely overlaps the area of the cut being simplified. The user then specifies another (additional) small modification for the same critical openings, or a subset thereof (in case certain openings now produce intensities that meet or exceed threshold they are omitted in this iteration). In this manner, the user iteratively makes a number of modifications for one or more openings (that are critical at each iteration) until a satisfactory complementary mask is obtained (e.g. wherein all openings meet/exceed the threshold). Note that instead of seeking user feedback during every iteration, the user feedback may be sought intermittently or not at all depending on the embodiment. For example, some embodiments may seek the user feedback on every alternate iteration while the system automatically makes a decision at the remaining iterations (e.g. when it is the system's turn to make a decision the system may check if a user-specified threshold intensity has been reached by all openings and if not reached then the system may automatically repeat the user-specified aerial increase for the openings that were still below threshold).

Note that the invention can be applied to any type of lithographic process for fabricating semiconductor chips, including processes that make use of, deep-ultraviolet (DUV) radiation, extreme ultraviolet (EUV) radiation, X-rays, etc., along with suitably modified masks.

What is claimed is:

1. A method for enhancing printability of a complementary mask in a sub-wavelength photolithographic process, the method comprising:
    receiving data corresponding to a complementary mask;
    wherein the complementary mask is designed for use with a phase shifting mask;
    wherein a pattern represented by said data of the complementary mask defines a number of openings that expose unwanted photoresist located between regions exposed via the phase shifting mask during the sub-wavelength photolithographic process;
    identifying from among said openings, a plurality of critical openings as being too small to print due to intensity of radiation passing therethrough being ineffective in exposing said unwanted photoresist during the sub-wavelength photolithographic process;
    determining a threshold intensity for radiation passing through the plurality of critical openings during the sub-wavelength photolithographic process, to be effective in erasing the unwanted photoresist;
    modifying at least a portion of the data representing the plurality of critical openings such that each of the plurality of critical openings will provide radiation of at least the threshold intensity during the sub-wavelength photolithographic process.

2. The method of claim 1, wherein modifying comprises:
    increasing the area of at least one opening in said plurality of critical openings.

3. The method of claim 2, wherein:
    the increase in area is substantially proportional to the difference between:
        a maximum intensity of radiation passing through the opening prior to increasing; and
        said threshold intensity.

4. The method of claim 2, wherein:
    said at least one opening is defined by a group of edges in said pattern; and
    the increase in area is accomplished by moving an edge in said group that does not abut any feature to be printed in an integrated circuit by use of the phase shifting mask, while maintaining unmoved any edge in the group that abuts said feature to be printed.

5. The method of claim 1 wherein identifying comprises:
    modeling exposures through a phase shifting mask and the complementary mask to produce a result and examining the result.

6. The method of claim 1 wherein the modifying comprises:
    simplifying a complex shape of at least one critical opening into a basic shape having fewer edges.

7. The method of claim 1 wherein:
    each critical opening is sufficiently small to be modeled by a pin hole.

8. A method for enhancing printability of a mask in a sub-wavelength photolithographic process, the method comprising:
    receiving data corresponding to a mask;
    identifying at least one opening in a pattern represented by the data, for being ineffective in allowing radiation passing therethrough to print said opening on photoresist, during the sub-wavelength photolithographic process;
    wherein said opening is defined by a group of edges in said pattern;
    modifying at least a portion of said data representing said opening, to allow passage therethrough of radiation sufficient to print said opening;
    wherein the modifying comprises moving an edge in said group that does not abut any feature to be printed in an integrated circuit while maintaining unmoved any edge in the group that abuts said feature to be printed.

9. The method of claim 8 further comprising:
    generating an aerial image of the mask;
    wherein the critical openings have areas too small to generate at least a predetermined maximum intensity of radiation in said aerial image.

10. A method for enhancing printability of a mask in a photolithographic process, the method comprising:
    receiving, data corresponding to a mask;
    identifying at least one opening in a pattern represented by the data, for ineffectiveness of radiation passing therethrough, to print said opening on photoresist during the photolithographic process;
    wherein said opening is defined by a group of edges in said pattern;
    modifying at least a portion of said data representing said opening, to allow passage therethrough of radiation sufficient to print the said opening on photoresist;
    wherein the modifying comprises simplifying a complex shape of said opening into a basic shape having fewer edges.

* * * * *